United States Patent
Park (10) Patent No.: US 8,339,864 B2
(45) Date of Patent: *Dec. 25, 2012

(54) METHOD OF PROGRAMMING NONVOLATILE MEMORY DEVICE

(75) Inventor: Jin Su Park, Buk-gu (KR)

(73) Assignee: Hynix Semiconductor Inc., Icheon-si (KR)

(*) Notice: Subject to any disclaimer, the term of this patent is extended or adjusted under 35 U.S.C. 154(b) by 11 days.

This patent is subject to a terminal disclaimer.

(21) Appl. No.: 13/019,174

(22) Filed: Feb. 1, 2011

(65) Prior Publication Data

US 2011/0122704 A1    May 26, 2011

Related U.S. Application Data

(62) Division of application No. 12/165,195, filed on Jun. 30, 2008, now Pat. No. 7,881,110.

(30) Foreign Application Priority Data

May 23, 2008 (KR) .................. 10-2008-0048167

(51) Int. Cl.
*G11C 16/04* (2006.01)

(52) U.S. Cl. .................. 365/185.28; 365/185.29

(58) Field of Classification Search .............. 365/185.28, 365/185.29, 185.12

See application file for complete search history.

(56) References Cited

U.S. PATENT DOCUMENTS

| | | | |
|---|---|---|---|
| 2002/0126535 A1* | 9/2002 | Roohparvar | 365/185.22 |
| 2005/0162909 A1* | 7/2005 | Wooldridge | 365/185.3 |
| 2006/0193178 A1* | 8/2006 | Roohparvar | 365/185.19 |
| 2009/0257282 A1 | 10/2009 | Kamei et al. | |

FOREIGN PATENT DOCUMENTS

| | | |
|---|---|---|
| JP | 07-249294 | 9/1995 |
| JP | 09-180481 | 7/1997 |
| JP | 2005-196931 | 7/2005 |
| JP | 2008-262623 | 10/2008 |
| JP | 2009-146510 | 7/2009 |
| KR | 1020040058533 A | 7/2004 |
| KR | 1020070094104 A | 9/2007 |
| WO | 2006/132818 | 12/2006 |

* cited by examiner

*Primary Examiner* — Vu Le (74) *Attorney, Agent, or Firm* — Kilpatrick Townsend & Stockton LLP (57) ABSTRACT

The present invention relates to a method of programming a nonvolatile memory device. A method of programming a nonvolatile memory device in accordance with an aspect of the present invention can include performing an erase operation, counting an erase pulse application number once the erase operation is completed, comparing the counted erase pulse application number and a reference, defining a program start voltage based on the comparison result, and performing a program operation using the defined program start voltage.

3 Claims, 5 Drawing Sheets

METHOD OF PROGRAMMING NONVOLATILE MEMORY DEVICE

CROSS-REFERENCES TO RELATED APPLICATIONS

The present application is a divisional of U.S. patent application Ser. No. 12/165,195, filed on Jun. 30, 2008, which claims priority to Korean patent application number 10-2008-0048167, filed on May 23, 2008, both of which are incorporated by reference in their entirety.

BACKGROUND OF THE INVENTION

The present invention relates to a method of programming nonvolatile memory devices.

In recent years, there is an increasing demand for nonvolatile memory devices which can be electrically programmed and erased and does not need to be periodically refreshed.

A nonvolatile memory device is a device that enables electrical program/erase operations, and performs the program and erase operations by changing the threshold voltage of a cell as electrons are moved by a strong electric field applied to a thin oxide layer.

The nonvolatile memory device typically includes a memory cell array in which cells for storing data are arranged in matrix form, and a page buffer for writing data into specific cells of the memory cell array or reading data stored in a specific cell. The page buffer includes bit line pairs coupled to specific memory cells and a register for temporarily storing data to be written into the memory cell array or reading data from a specific cell of the memory cell array and temporarily storing the read data. It also includes a sense node for sensing the voltage level of a specific bit line or a specific register, and a bit line select unit for controlling whether the specific bit line and the sense node have been coupled or not.

In a program operation of this nonvolatile memory device, there occurs a phenomenon in which a program speed changes according to the characteristics of cells and in the number of program/erase cycles. Meanwhile, the program operation of a nonvolatile memory device is carried out using an incremental step pulse program (ISPP) method. It is necessary to set a program start voltage in consideration of the program speed of each cell.

BRIEF SUMMARY OF THE INVENTION

The present invention relates to a method of programming a nonvolatile memory device, which can set a program start voltage differently according to the program speed of each cell.

A method of programming a nonvolatile memory device in accordance with an aspect of the present invention includes performing a program operation on a first page, counting a program pulse application number until the program operation on the first page is completed, comparing the counted program pulse application number and a critical value and resetting a program start voltage based on the comparison result, and performing a program operation on a second page using the reset program start voltage.

A method of programming a nonvolatile memory device in accordance with another aspect of the present invention includes performing an erase operation, counting an erase pulse application number until the erase operation is completed, comparing the counted erase pulse application number and a critical value and setting a program start voltage based on the comparison result, and performing a program operation using the set program start voltage.

A method of programming a nonvolatile memory device in accordance with still another aspect of the present invention includes performing an erase operation, counting an erase pulse application number until the erase operation is completed, comparing the counted erase pulse application number and a critical value and setting a post program start voltage based on the comparison result, performing a post program operation and a verify operation using the set post program start voltage, and performing a program operation on cells on which the post program operation has been completed.

A method of programming a nonvolatile memory device in accordance with further still another aspect of the present invention includes providing a memory cell on which an erase operation has been completed, performing a post program operation on the memory cell, counting a post program pulse application number until the post program operation is completed, comparing the counted post program pulse application number and a critical value and setting a program start voltage based on the comparison result, performing a program operation and a verify operation using the set program start voltage.

A method of programming a nonvolatile memory device in accordance with further still another aspect of the present invention includes performing a program operation of a first logical page with respect to a first physical page, counting a program pulse application number until the program operation of the first logical page is completed, comparing the counted program pulse application number and a critical value and resetting a program start voltage based on the comparison result, and performing a program operation of a second logical page with respect to the first physical page using the reset program start voltage.

DESCRIPTION OF SPECIFIC EMBODIMENT

Specific embodiments according to the present invention will be described with reference to the accompanying drawings. However, the present invention is not limited to the disclosed embodiment, but may be implemented in various ways. The embodiments are provided to complete the disclosure of the present invention and to allow those having ordinary skill in the art to understand the scope of the present invention. The present invention is defined by the category of the claims.

Figure 1:
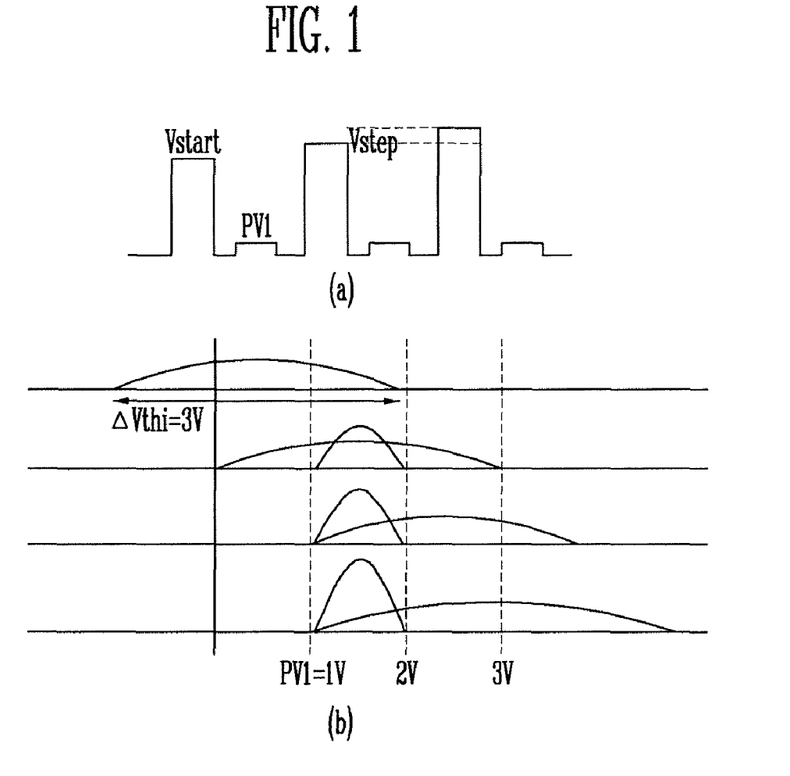
FIG. 1 is a diagram showing a typical ISPP method of a nonvolatile memory device.

FIG. 1 is a diagram showing a typical ISPP method of a nonvolatile memory device. The ISPP method includes applying a plurality of program pulses to memory cell to be programmed and performing a verify operation immediately after the application of each program pulse. When an $(n+1)^{th}$ program pulse is applied the voltage is increased by a step pulse (Vstep) from the $n^{th}$ program pulse. If a program voltage is increased from a start voltage (Vstart) by a step voltage (Vstep) and applied as described above, the threshold voltage distribution of respective cells can be narrowed.

Meanwhile, the threshold voltage distributions of each cell has a wide unique distribution (Vthi) according to several process conditions, such as a channel width, a channel length, an oxide layer thickness, etc. of each memory cell. If an ISPP method is performed according to a specific step voltage (Vstep) when the unique distribution (Vthi) is 3V as shown in FIG. 1, the number of required program pulses becomes the unique distribution (Vthi)/a step voltage (Vstep). That is, when the step voltage is low, a more dense distribution width can be obtained, but the number of pulses is increased. It is also necessary to apply a program start voltage in consideration of a difference in the program speed according to the characteristics of each cell or the number of program/erase cycles (or E/W cycling number) as well as this unique distribution characteristic.

Figure 2:
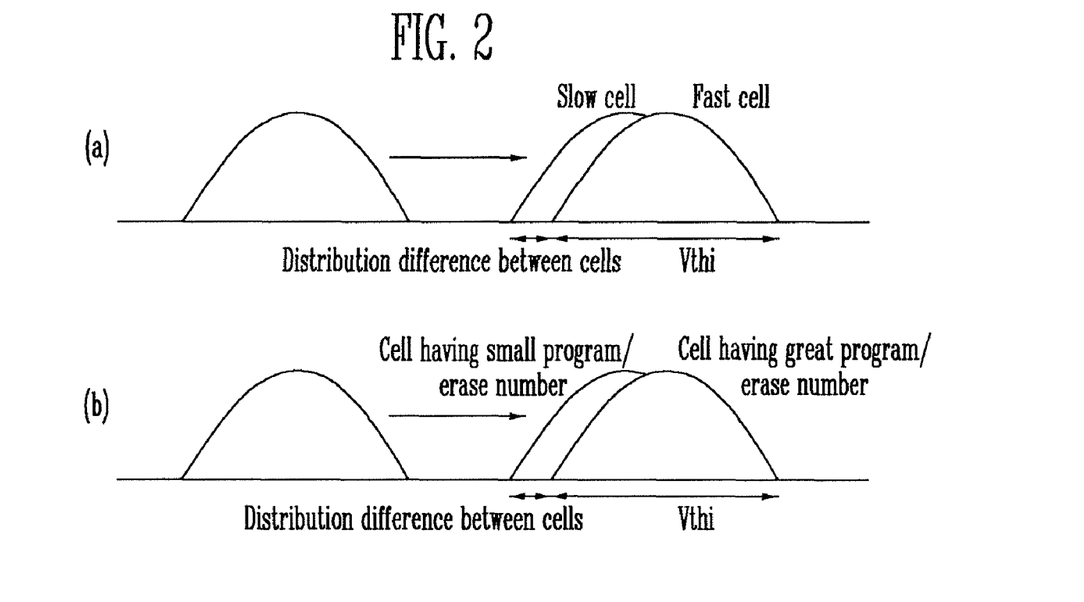
FIG. 2 is a diagram showing a difference in the program speed according to characteristics of cells or the number of program/erase cycles in a typical nonvolatile memory device.

FIG. 2 is a diagram showing a difference in the program speed according to cell characteristics or the number of program/erase cycles in a typical nonvolatile memory device.

Although the same program voltage is applied in terms of the characteristics of each cell, there is a difference in the threshold voltage. As shown in FIG. 2(a), cells having relatively high threshold voltages are called fast cells, and cells having relatively low threshold voltages are called slow cells. Although the same program voltage is applied, there is a difference in the program speed. Here, the program speed refers to voltage of a program pulse applied in the state in which programming has been completed.

In this case, a problem arises because more program pulses need to be applied to cells having a slow program speed, i.e., the cells whose threshold voltages change by a smaller amount than others. For example, assuming that a step voltage (Vstep) is 200 mV and a difference in the program speed between cells is 1V, it can be seen that there is a difference in the program time by as many as 5 (1V/200 mV) pulses. In this case, five pulses must be additionally applied to the slow cell.

FIG. 2(b) shows a difference in the threshold voltage distribution according to the number of program/erase cycles. As the number of program/erase cycles increases, charges trapped at a floating gate increases. Although a low program voltage is applied, the threshold voltage rises abruptly. In other words, although the same program pulse is applied, the program speed of a cell having a large number of program/erase cycles becomes fast. The program speed can be defined as the number of program pulses applied until the program is completed. Therefore, a program start voltage should be set low in consideration of an increase in the program speed. For example, in the case in which a difference in the program speed of different cells whose difference in the number of program/erase cycles is 10K is 1V, when a step voltage (Vstep) is 200 mV, it can be seen that there is a difference in the speed as much as 5 (1V/200 mV) pulses. Accordingly, five pulses have to be applied to cells having a small number of program/erase cycles.

As described above, it can be seen that there is a difference in the program speed according to the characteristics of each cell or a difference in the number of program/erase cycles. When there is a difference in the program speed as described above, a program start voltage is set based on the fastest program speed. Accordingly, the time taken for a total program operation increases since more program pulses have to be applied to cells having a slow program speed.

Figure 3:
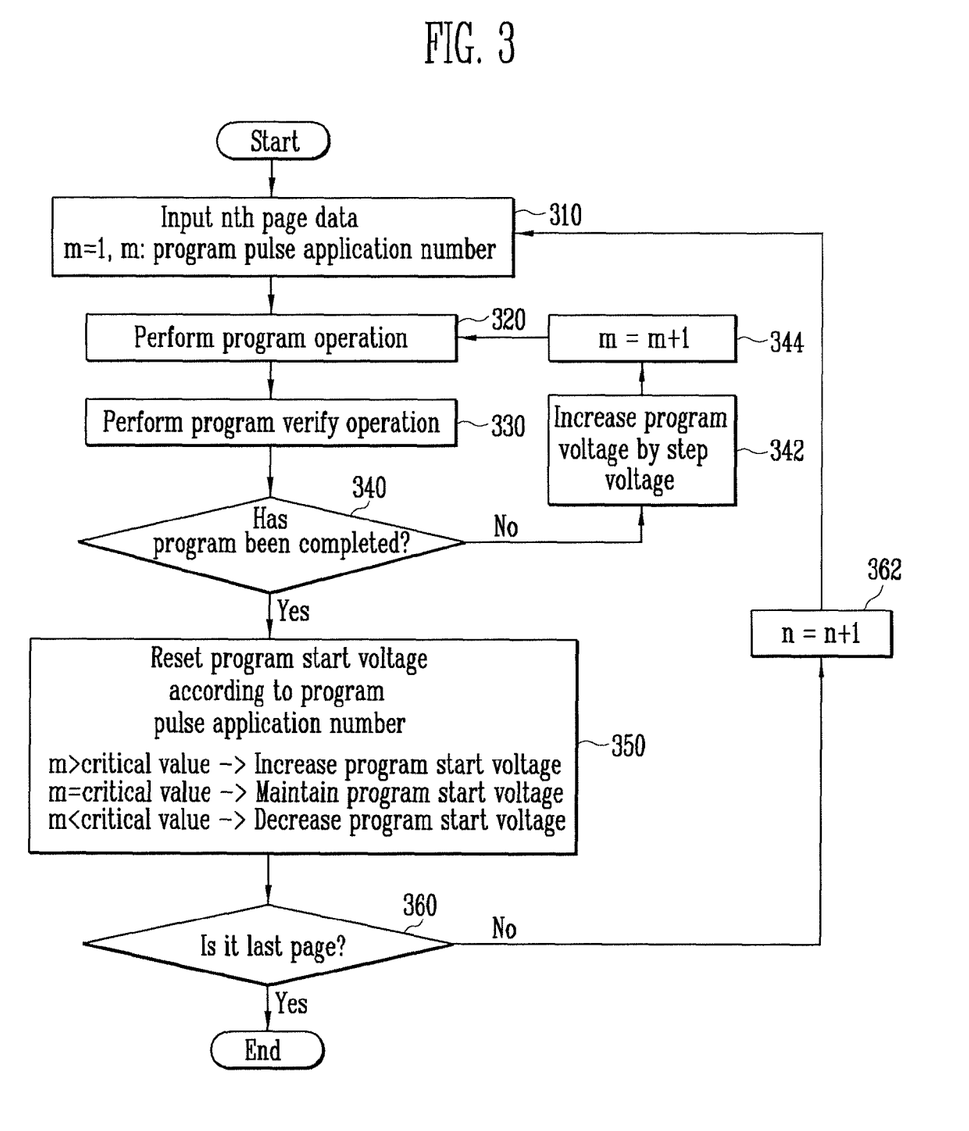
FIG. 3 is a flowchart illustrating a method of programming a nonvolatile memory device in accordance with an embodiment of the present invention.

FIG. 3 is a flowchart illustrating a method of programming a nonvolatile memory device in accordance with an embodiment of the present invention. At step 310 an $n^{th}$ page of data is input.

A program operation is typically performed on a page basis. Data to be programmed into the $n^{th}$ page is input to a page buffer, and the level of voltage applied to a sense node SO is changed according to the data. Meanwhile, a program pulse application number value m is reset to 1.

At step 320, the program operation is performed according to a program start voltage. A program voltage is applied to word lines including target program cells according to the ISPP method.

A program verify operation is performed for determining whether the target program cells have been programmed to have at least a reference voltage (step 330) The verify operation is carried out according to the verify operation of a typical nonvolatile memory device. That is, the voltage level of the bit line is changed depending on whether the threshold voltage of the target verify cells has risen higher than the reference voltage. Typically, only when the threshold voltage of the target verify cells has risen higher than the reference voltage, the voltage level of the bit line remains intact, and otherwise the voltage level of the bit line is discharged to a low level.

At step 340, a determination is made whether all target program cells have been programmed. If, all target program cells have been programmed to have at least the reference voltage as their threshold voltages, the operation proceeds to step 350. If, there is a cell having a threshold voltage that is lower than the reference voltage, the program voltage is increased by an increment or a step voltage (step 342). The program pulse application number value m is increased by 1 (step 344). The program operation is performed again (step 320).

On the other hand, all target program cells are determined to have at least the reference voltage as their threshold voltages, the program start voltage is reset (i.e., recalibrated) according to the program pulse application number m (step 350).

If the program pulse application number m when the program operation is completed is greater than a critical value (or reference value), a program speed is determined to be slow and therefore the program start voltage is increased. Here, a program start voltage can be increased by a number corresponding to a difference in the program pulse application number and the critical value. For example, when the program pulse application number is 13 and the critical value is 10, the program start voltage can be increased by 3 times the step voltage.

If the program pulse application number is smaller than the critical value when the program operation is completed (i.e., at step 350), a program speed is determined to be fast and therefore the program start voltage is lowered. Here, a program start voltage can be decreased by a number corresponding to a difference in the program pulse application number and the critical value. For example, when the program pulse application number is 7 and the critical value is 10, the program start voltage can be decreased by 3 times the step voltage. In other embodiments, the program start voltage may be decreased by a different amount.

If the program pulse application number is identical to the critical value when the program operation is completed, the program start voltage remains the same.

Next, if there is another page to be programmed, the program operation is repeated using the recalibrated program start voltage in steps 360, 362, 310, and 320.

Since the program start voltage has been recalibrated in step 350, the program operation is performed according to the corresponding voltage.

As described above, a program voltage pulse application number is counted on a page basis, and a program start voltage is reset (or recalibrated) based on the counted program voltage pulse application number. A program operation is performed on a next page using the recalibrated program start voltage.

Figure 4:
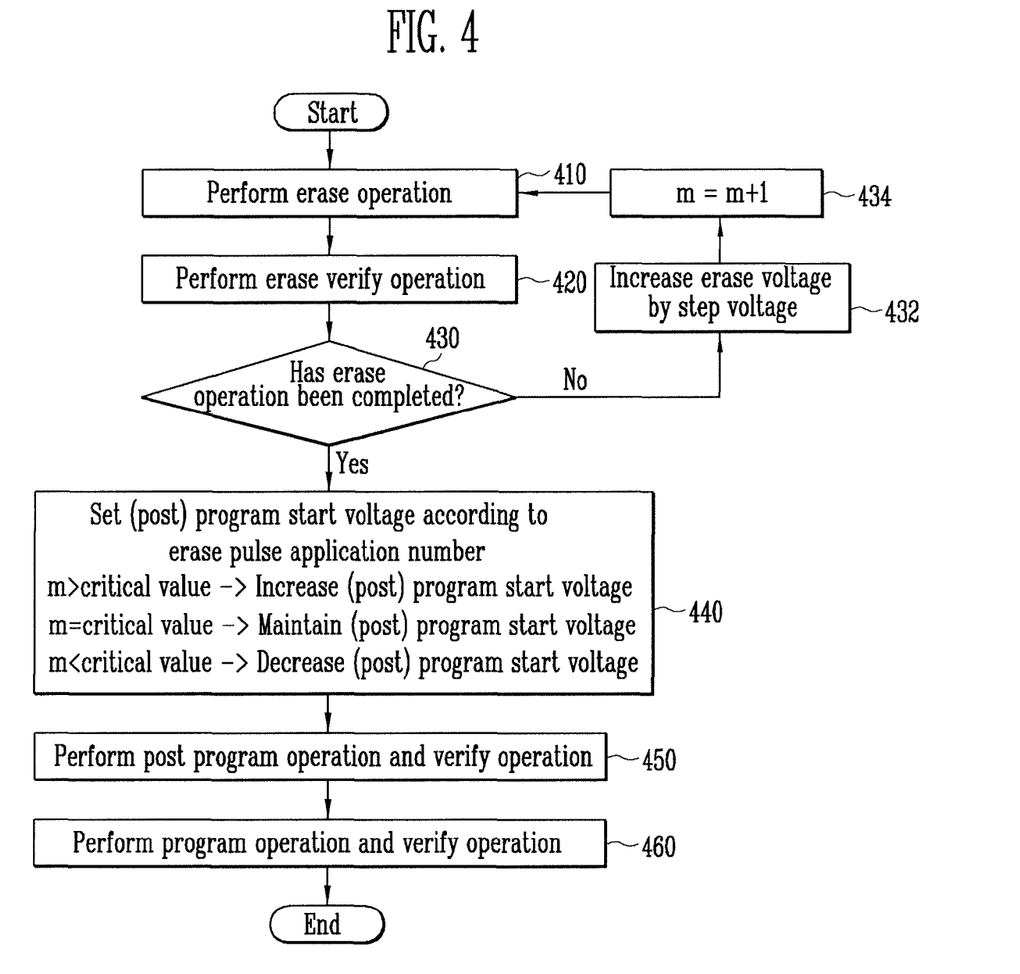
FIG. 4 is a flowchart illustrating a method of programming a nonvolatile memory device in accordance with another embodiment of the present invention.

FIG. 4 is a flowchart illustrating a method of erasing and programming a nonvolatile memory device in accordance with another embodiment of the present invention. Meanwhile, a post program start voltage may be set according to an erase pulse application number. It is known that the post program operation is performed in order to narrow the threshold voltage distribution of the entire erased cells after an erase operation is carried out. In other words, a program operation is performed on the erased cells, but performed to control a maximum threshold voltage not to exceed 0V, so that threshold voltage distributions of the entire erased cells are narrowed. Accordingly, the post program operation is performed according to an operation similar to a program operation.

In the present invention, a method of setting a post program start voltage according to an erase pulse application number is described as an example.

At step 410 an erase operation is performed. The erase operation is performed on a block basis and is carried out according to a typical incremental step pulse erasing (ISPE) method.

Next, an erase verify operation is performed in step 420. In this operation, it is determined whether the threshold voltage of target erase cells is lower than 0V.

It is then determined whether all the target erase cells have been erased in step 430. If there are any cells that have not been erased, an erase voltage is increased by a step voltage, and the erase operation is repeated in steps 432, 434, and 410. Thus, an erase pulse application number is also increased by 1.

If all the target erase cells have been erased, a program start voltage or a post program start voltage is set according to an erase pulse application number in step 440.

If the erase pulse application number when the erase operation is completed is greater than a critical value, the program speed is determined to be fast and therefore the program start voltage is lowered. There is a tendency for the threshold voltage of a program state to rise as the number of program/erase cycles increases. Here, a program start voltage is lowered by a number corresponding to a difference between the erase pulse application number and the critical value. For example, when the erase pulse application number is 13 and the critical value is 10, the program start voltage is lowered by 3 times the step voltage. In other embodiments, the program start voltage may be lowered by a different amount.

If the erase pulse application number when the erase operation is completed is smaller than a critical value, the program speed is determined to be slow and therefore the program start voltage is raised. Here, a program start voltage is increased by a number corresponding to a difference between the erase pulse application number and the critical value. For example, when the erase pulse application number is 7 and the critical value is 10, the program start voltage is lowered by 3 times the step voltage. In other embodiments, the program start voltage may be increased by a different amount.

If the erase pulse application number when the erase operation is completed is identical to a critical value, the program start voltage remains the same.

A post program operation and a verify operation on the post program operation are then performed in step 450. At this time, the post program operation is performed using the set post program start voltage in step 440.

A program operation and a verify operation on the program operation are then performed in step 460. At this time, the program operation is carried out using the set program start voltage in step 440. Here, the program operation is performed according to the above ISPP method. Alternatively, the program operation may be performed using the embodiment described in FIG. 3, where the program start voltage is recalibrated after each page of data is programmed.

As described above, an erase pulse application number is counted, and a program start voltage and a post program start voltage is recalibrated based on the counted erase pulse application number. A program operation or a post program operation is performed using the recalibrated program start voltage or the recalibrated post program start voltage.

Figure 5:
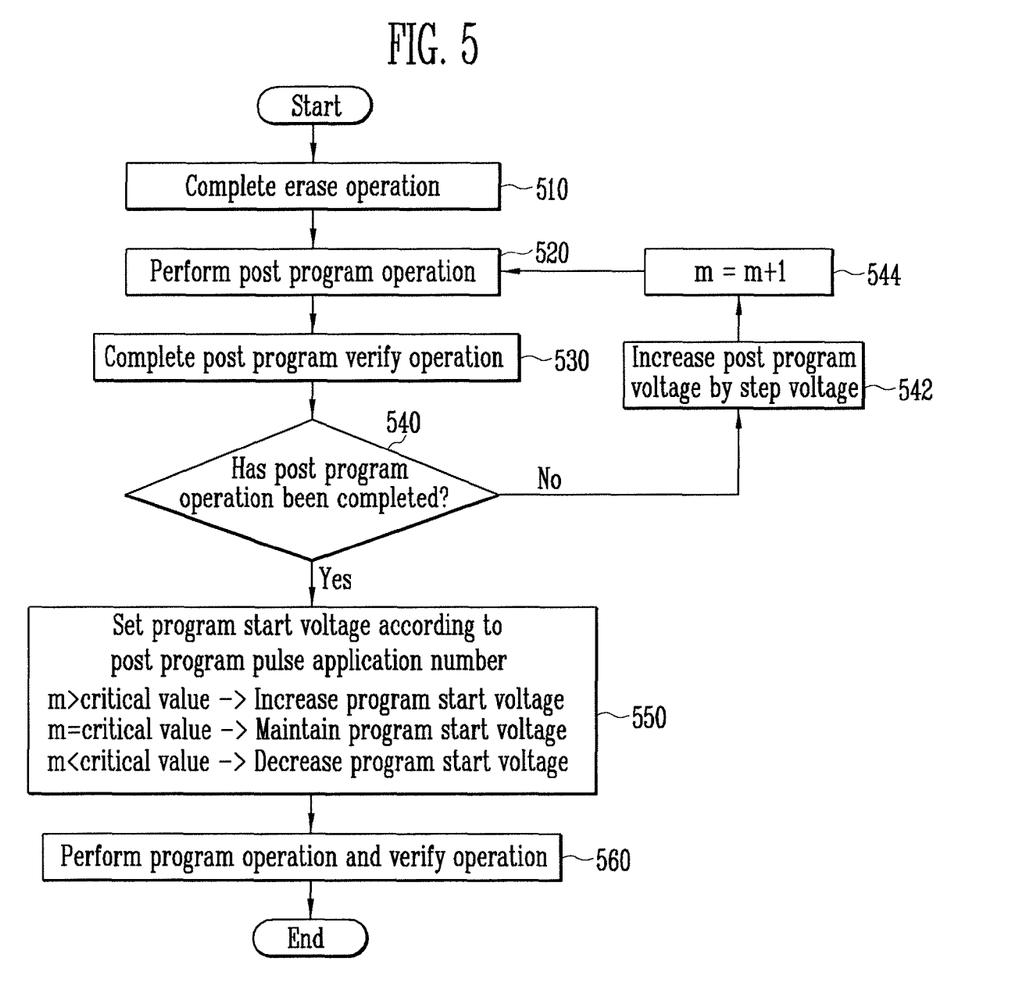
FIG. 5 is a flowchart illustrating a method of programming a nonvolatile memory device in accordance with still another embodiment of the present invention.

FIG. 5 is a flowchart illustrating a method of programming a nonvolatile memory device in accordance with still another embodiment of the present invention. An erase operation is completed in step 510. The erase operation is performed on a block basis and is performed using a typical ISPE method.

A post program operation is then performed in step 520. The post program operation is performed so as to narrow the threshold distribution of the erased cells. A detailed operation of the post program operation is similar to a program operation. That is, the post program operation is carried out according to the ISPP method. Here, a post program start voltage can be a start voltage based on the erase pulse application number according to the embodiment of FIG. 4.

Next, a verify operation is performed on the post program operation in step 530. Typically, when the cells are programmed to have 0V or less, it is determined that the post program operation has been completed.

At step 540, it is then determined whether the post program operation on the erase cells has been completed in step 540. If, the post program operation is determined to have been completed, a next operation (step 550) is performed.

However, if it is determined that the post program operation has not been completed, a program voltage is increased by a step voltage, and the post program operation is repeated in steps 542, 544, and 520. Thus, a post program pulse application number is also increased by 1.

If the post program operation has been completed, the program start voltage is recalibrated according to a post program pulse application number in step 550.

If the post program pulse application number when the post program operation is completed is greater than a critical value, the program speed is determined to be slow and the post program start voltage is increased. Here, a program start voltage is increased by a number corresponding to a difference between the post program pulse application number and the critical value. For example, when the post program pulse application number is 13 and the critical value is 10, the program start voltage is increased by 3 times the step voltage. In other embodiments, the program start voltage may be increased by a different amount.

If the post program pulse application number when the post program operation is completed is smaller than a critical value, the program speed is determined to be fast and the post program start voltage is decreased. Here, a program start voltage is decreased by a number corresponding to a difference between the post program pulse application number and the critical value. For example, when the post program pulse application number is 7 and the critical value is 10, the program start voltage is decreased by 3 times the step voltage. In other embodiments, the program start voltage may be decreased by a different amount.

If the post program pulse application number when the post program operation is completed is identical to a critical value, the post program start voltage remains the same.

A program operation and a verify operation on the program operation are then performed in step 560. Here, the program operation is performed according to the set program start voltage. The program operation is performed according to the above ISPP method. Alternatively, the program operation may be performed by the embodiment described in FIG. 3, where the program start voltage is recalibrated after each page of data is programmed.

As described above, a post program pulse application number is counted, and a program start voltage is recalibrated based on the counted post program pulse application number. A program operation is performed using the recalibrated program start voltage.

Figure 6:
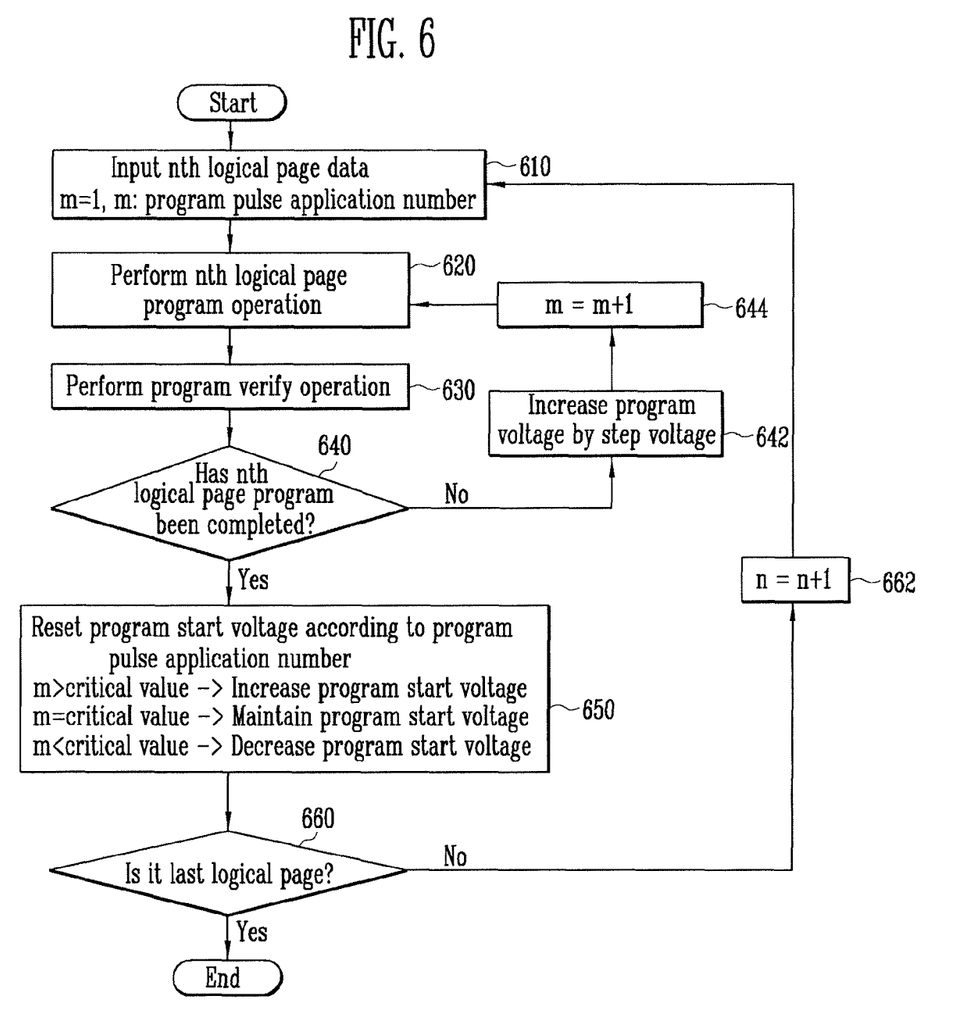
FIG. 6 is a flowchart illustrating a method of programming a nonvolatile memory device in accordance with further still another embodiment of the present invention.

FIG. 6 is a flowchart illustrating a method of programming a nonvolatile memory device in accordance with further still another embodiment of the present invention. The present embodiment relates to programming multi-level cells where a plurality of logical pages are defined within one physical page.

An $n^{th}$ logical page of data is input to a specific physical page in step 610.

A program operation is typically performed on a page basis. The $N^{th}$ logical page of data to be programmed into a specific physical page is input to a page buffer, and the voltage level applied to a sense node SO is changed according to the data. Meanwhile, a program pulse application number value m is reset to 1.

At step 620, the program operation is performed according to a program start voltage. A program voltage is applied according to the ISPP method.

A program verify operation for determining whether target program cells have been programmed to have a reference voltage or more is then performed in step 630. The verify operation is performed according to the verify operation of a typical nonvolatile memory device.

It is then determined whether the threshold voltages of all target program cells have been programmed to be at least the reference voltage (step 640). If the threshold voltages of the target program cells have all been programmed to be at least the reference voltage, a next operation (step 650) is performed. If there is a cell with a threshold voltage that is lower than the reference voltage, the program voltage is increased by a step voltage, and the program operation is repeated in steps 642, 644, and 620. At this time, since the program operation is repeated, a program pulse application number is increased by 1.

If the threshold voltages of the target program cells have all been programmed to have at least the reference voltage, the program start voltage is recalibrated according to a program pulse application number (step 650).

If the program pulse application number when the program operation is completed is greater than a critical value, the program speed is determined to be slow and the program start voltage is increased. Here, a program start voltage is increased by a number corresponding to a difference between the program pulse application number and the critical value. For example, when the post program pulse application number is 13 and the critical value is 10, the program start voltage is increased by 3 times the step voltage. In other embodiments, the program start voltage may be increased by a different amount.

If the program pulse application number when the program operation is completed is smaller than a critical value, the program speed is determined to be fast, and the program start voltage is decreased. Here, a program start voltage is decreased by a number corresponding to a difference between the program pulse application number and the critical value. For example, when the post program pulse application number is 7 and the critical value is 10, the program start voltage is decreased by 3 times the step voltage. In other embodiments, the program start voltage may be decreased by a different amount.

If the program pulse application number when the program operation is completed is identical to a critical value, the program start voltage remains the same.

Next, if there are any more logical pages that need to be programmed, the program operation is repeated using the recalibrated program start voltage in step 660, 662, 610, and 620.

Since the program start voltage has been recalibrated in step 650, the program operation is performed according to a corresponding voltage.

As described above, a program voltage pulse application number is counted on a logical-page basis, and a program start voltage is recalibrated based on the counted program voltage pulse application number. A program operation is performed on a following page using the recalibrated program start voltage.

In accordance with the above configurations of the present invention, a program start voltage can be set differently according to a program speed. That is, at the time of a program operation for a page of data, a program speed is measured by counting a program pulse application number and, at the time of a program operation of a following page of data, a program start voltage is recalibrated based on the measured program speed. That is, a program start voltage can be changed according to a program speed. Alternatively, various methods of measuring a program speed may be used. Further, a program speed can be measured on the basis of an erase pulse application number or a post program pulse application number in addition to the program pulse application number. According to the configurations, the programming time can be reduced. Further, distributions of respective cells after a program operation can be maintained uniformly.

The embodiments disclosed herein have been proposed to allow a person skilled in the art to easily implement the present invention, and the person skilled in the part may implement the present invention in various ways. Therefore, the scope of the present invention is not limited by or to the embodiments as described above, and should be construed to be defined only by the appended claims and their equivalents.

What is claimed is:

1. A method of programming a nonvolatile memory device, the method comprising:
   performing an erase operation;
   counting an erase pulse application number once the erase operation is completed;
   comparing the counted erase pulse application number and a reference value;
   defining a program start voltage based on the compared result; and
   performing a program operation using the defined program start voltage.

2. The method of claim 1, wherein the defining of the program start voltage comprises:
- when the erase pulse application number is greater than the reference value, decreasing the program start voltage;
- when the erase pulse application number is smaller than the reference value, increasing the program start voltage; and
- when the erase pulse application number is identical to the reference value, maintaining the program start voltage.

3. The method of claim 1, wherein the counting of the erase pulse application number comprises:
- performing an erase verify operation; and
- when any one of target erase cells is in a program state, increasing an erase voltage by a step voltage and increasing the erase pulse application number by 1.

* * * * *